(12) United States Patent
Williamson et al.

(10) Patent No.: US 6,707,017 B2
(45) Date of Patent: Mar. 16, 2004

(54) HIGH-POWER MICROWAVE WINDOW

(75) Inventors: Weldon Stoddard Williamson, Malibu, CA (US); Robert B. Hallock, Newton, NH (US); Charles B. Willingham, Framingham, MA (US); Richard M. Alexy, Newton, MA (US)

(73) Assignee: Rayth on Company, Waltham, MA (US)

( * ) Notice: Subject to any disclaimer, the term of this patent is extended or adjusted under 35 U.S.C. 154(b) by 37 days.

(21) Appl. No.: 10/150,132

(22) Filed: May 16, 2002

(65) Prior Publication Data

US 2003/0213800 A1 Nov. 20, 2003

(51) Int. Cl.$^7$ .................................................. H05B 6/80
(52) U.S. Cl. ....................................... 219/690; 219/740
(58) Field of Search .................................. 219/690, 740, 219/691, 695–696, 697, 707, 749, 752, 756, 759, 121.4, 121.43; 333/252, 99 PL, 35; 315/111.21; 118/723 MW, 723 AN; 156/345.42, 345.48

(56) References Cited

U.S. PATENT DOCUMENTS 4,620,170 A * 10/1986 Lavering ..................... 333/252
4,931,756 A * 6/1990 Doehler et al. ............. 333/252

FOREIGN PATENT DOCUMENTS

DE         3228367 A  *  2/1984  ............ H01J/23/32

* cited by examiner

*Primary Examiner*—Quans T. Van
(74) *Attorney, Agent, or Firm*—Daly, Crowley & Mofford, LLP

(57) ABSTRACT

A microwave window structure for a low-pressure chamber is provided. The window structure enables microwave energy to be introduced into the chamber from a source external to the chamber. The window structure includes a fixture having electrically conductive walls. Inner portions of the walls provide a peripheral region of an aperture within such fixture. The fixture is adapted for mounting to a sidewall portion of the chamber. A solid, microwave energy transparent dielectric window is included. The window includes: a periphery portion affixed to the fixture; and, an inner region disposed within the aperture of the fixture.

18 Claims, 8 Drawing Sheets

HIGH-POWER MICROWAVE WINDOW

TECHNICAL FIELD

This invention relates to microwave windows, and more particularly to microwave windows adapted for use in a low-pressure (i.e., vacuum) chamber to enable the introduction of high-power microwave energy from a source external to the chamber to pass through such window into such chamber.

BACKGROUND

As is known in the art, many applications require the introduction of high-power microwave energy into a low-pressure chamber from a microwave source external to the chamber. One such application is plasma enhanced chemical vapor deposition (PECVD) processing. In such application, the microwave energy is introduced into the chamber (or reactor) through a dielectric window. Thus, the window is disposed on an open portion of the wall of the chamber. A waveguide terminates on an outer surface of the window. Because the gas pressure in the chamber (or reactor) is low and the microwave electric field (i.e., the E-field) is at its highest level at the reactor, there is a problem of Paschen breakdown on the window. When this occurs, high-density plasma forms on the reactor side (i.e., low pressure or vacuum-side) of the window. This plasma strongly absorbs the incoming microwave energy leading to high localized heating of the window. Under certain conditions, this heating causes failure of the window due to thermal shock. Window failure causes the reactor to vent air thereby destroying the high vacuum within the chamber and the desired processing within the chamber.

SUMMARY

In accordance with the present invention, a microwave window structure for a low-pressure chamber is provided. The window structure enables microwave energy to be introduced into the chamber from a source external to the chamber. The window structure includes a fixture having electrically conductive walls. Inner portions of the walls provide a peripheral region of an aperture within such fixture. The fixture is adapted for mounting to a sidewall portion of the chamber having an opening therethrough. A solid, microwave energy transparent dielectric window is included in the window structure. The window includes: a periphery portion affixed to the fixture; and, an inner region disposed with the aperture of the fixture and aligned with the opening through the chamber sidewall portion. A first surface of the inner region is disposed in the chamber through the chamber opening. A second, opposite surface of the inner region widow is disposed external to the chamber. The window has a sidewall portion with a first end thereof terminating in the first surface of the window and a second end thereof terminating at the periphery portion of the window. The sidewall portion of the window is spaced from the walls of the conductive fixture.

With such an arrangement, the junction at the contact between conductive wall of the fixture, the dielectric window, and the vacuum within the chamber (a so-called "triple junction") is displaced from the conductive walls of the fixture. More particularly, one key phenomenon in initiating microwave breakdown across a surface is injection of electrons onto the dielectric surface from the triple junction. Here, electrons are field-emitted from the conductive surface, especially from sharp edges or burrs in the walls. Each collision between the emitted electrons with the surface of the dielectric window multiplies the number of electrons because the secondary yield of most dielectrics is greater than unity (for example, up to a multiplier of 4 for silica). As the electrons cross the surface of the dielectric window they produce avalanche, causing ionization and gas breakdown to occur on the window.

In one embodiment, the periphery portion of the window contacts the inner portions of the walls of the fixture adjacent a rounded region of such inner portions of the walls. With such an arrangement, the rounded region reduces the amplitude of the electric field at the triple junction therefore the number of field emitted electrons is correspondingly reduced.

In one embodiment, the sidewall portion of the window is parallel to the inner walls of the fixture. With such an arrangement, the direction of the electric field established across opposing portions of the conductive wall is normal to the surface of the adjacent portion of the window (i.e., normal to the displaced sidewalls of the window).

In one embodiment, the second surface of the window includes thereto a corrugated structure. With such an arrangement, the magnitude of the electric field is more uniform across the window thereby reducing the peak electric field across the window.

In one embodiment, the first surface of the window has peaks and valleys therein, such peaks being separated one from the other by a length less than the nominal-operating wavelength of the microwave energy being introduced into the chamber through the window. With such an arrangement, the inner surface portion of the window is parallel to the electric field vector is broken up by the subwavelength structures (i.e., the peaks and valleys) to reduce the probability of surface-discharge formation; in addition the same subwavelength structures are designed to eliminate microwave reflections caused by the large differential in dielectric constant between the window and the vacuum.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
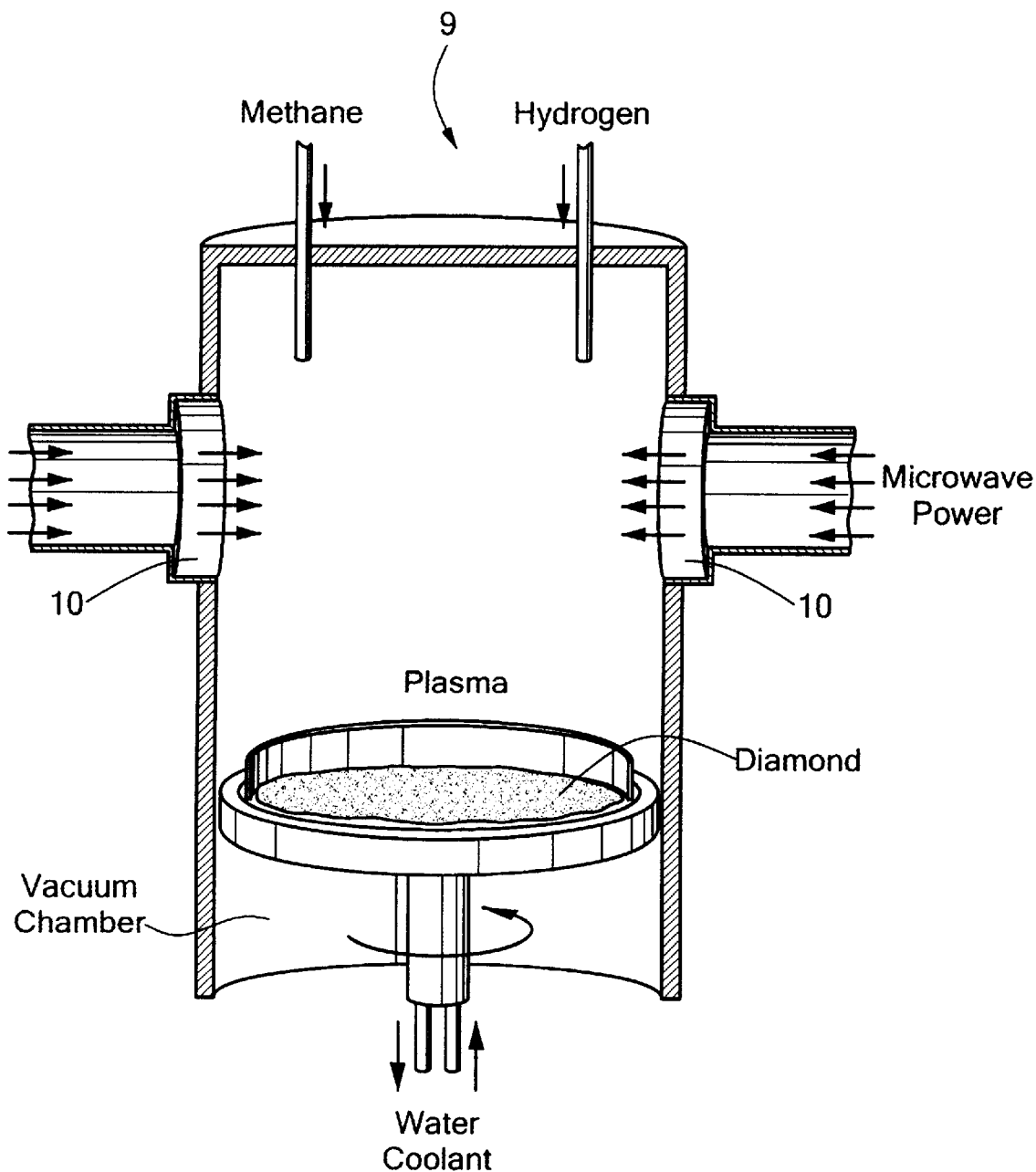
FIG. 1 is a sketch of a vacuum deposition chamber having a pair of microwave windows according to the invention.

Referring now to FIG. 1 a chemical vapor deposition chamber 9 is shown. The chamber 9 has a pair of microwave windows 10 for introducing microwave energy into the chamber 9.

Figure 2:
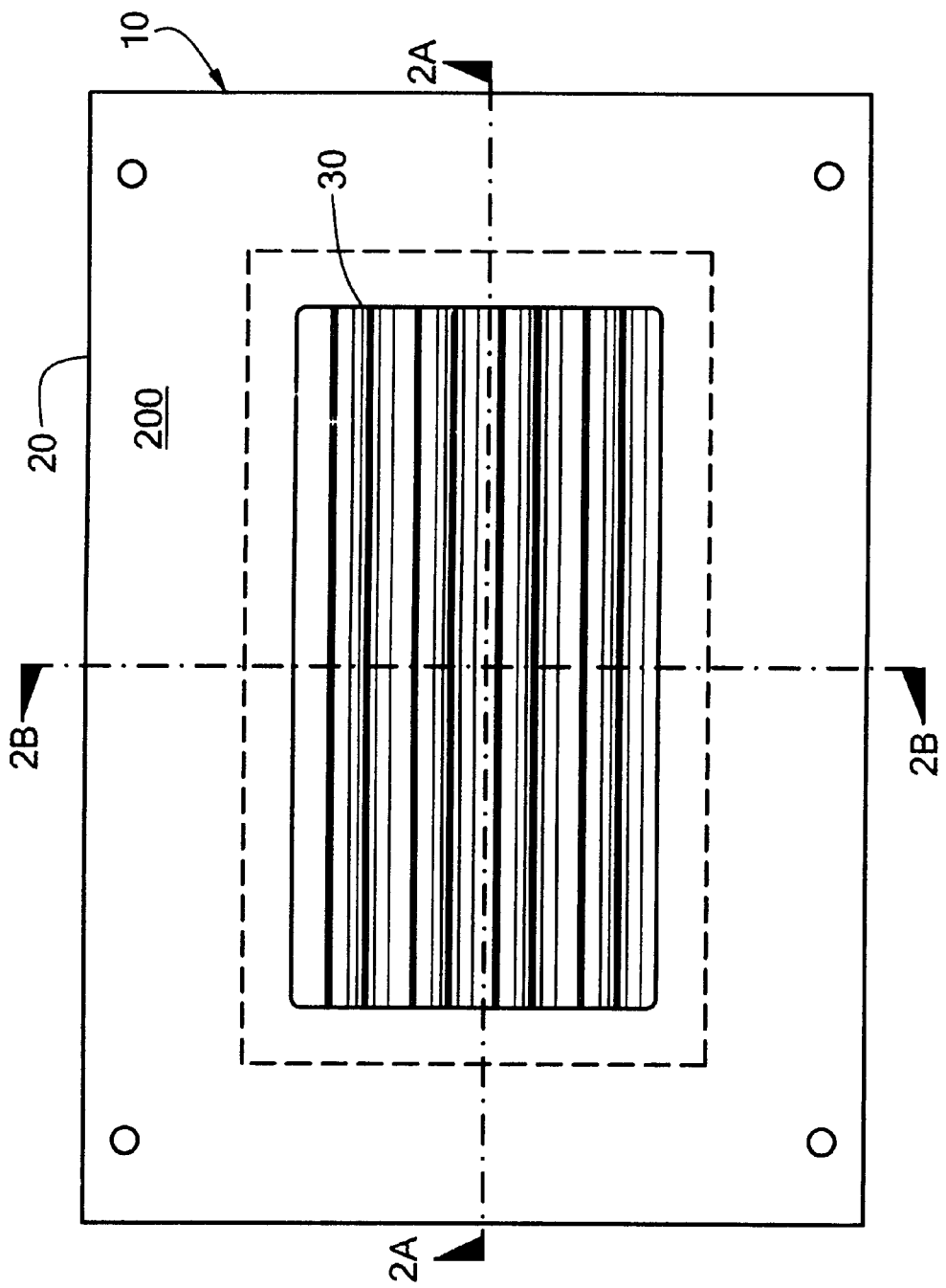
FIG. 2 is a plan, top view of the microwave window structure according to the invention.
Figure 2A:
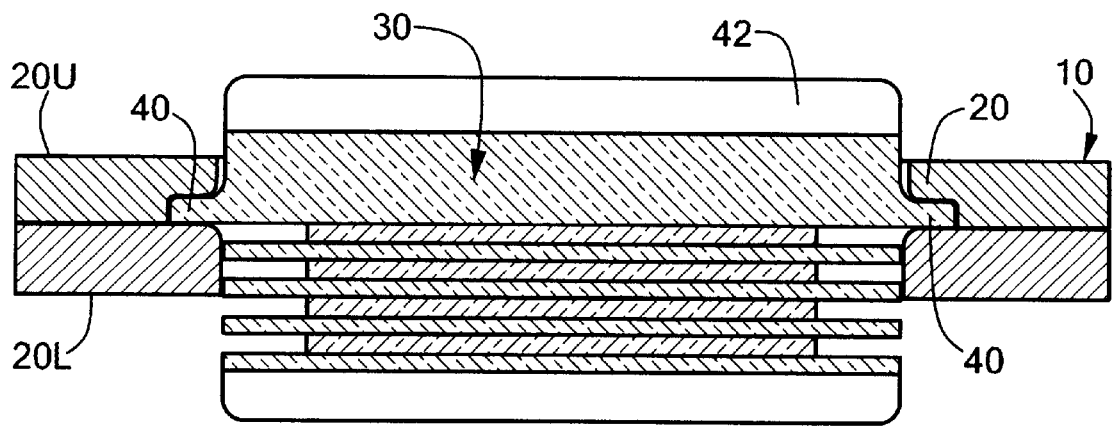
FIG. 2A is a cross-sectional view of the microwave window structure of FIG. 1, such cross-section being taken along line 2A—2A of FIG. 2.
Figure 2B:
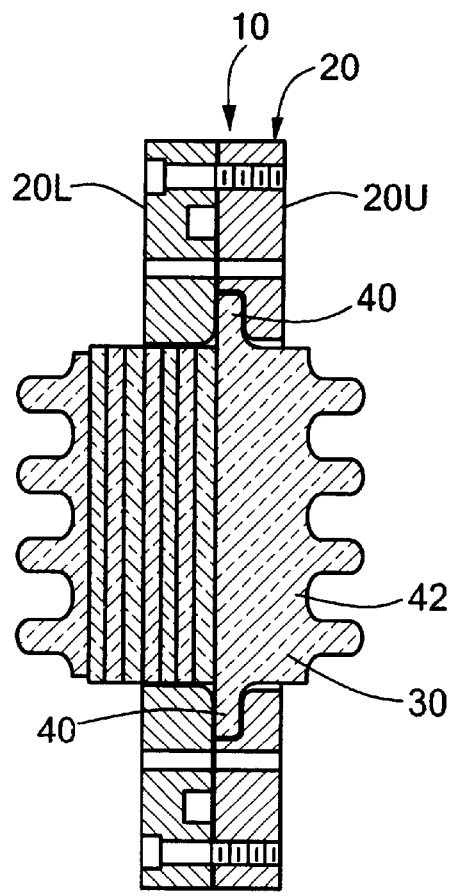
FIG. 2B is a cross-sectional view of the microwave window structure of FIG. 2, such cross-section being taken along line 2B—2B of FIG. 2.

Referring now to FIGS. 2, 2A and 2B, a microwave window structure 10 for a low-pressure chamber 12 (FIGS. 2A and 2B) is shown. The window structure 10 enables microwave energy to be introduced into the chamber 12 from a radio frequency (R.F.), here microwave energy source 14 external to the chamber 12, as shown in FIGS. 2A and 2B.

Figure 3A:
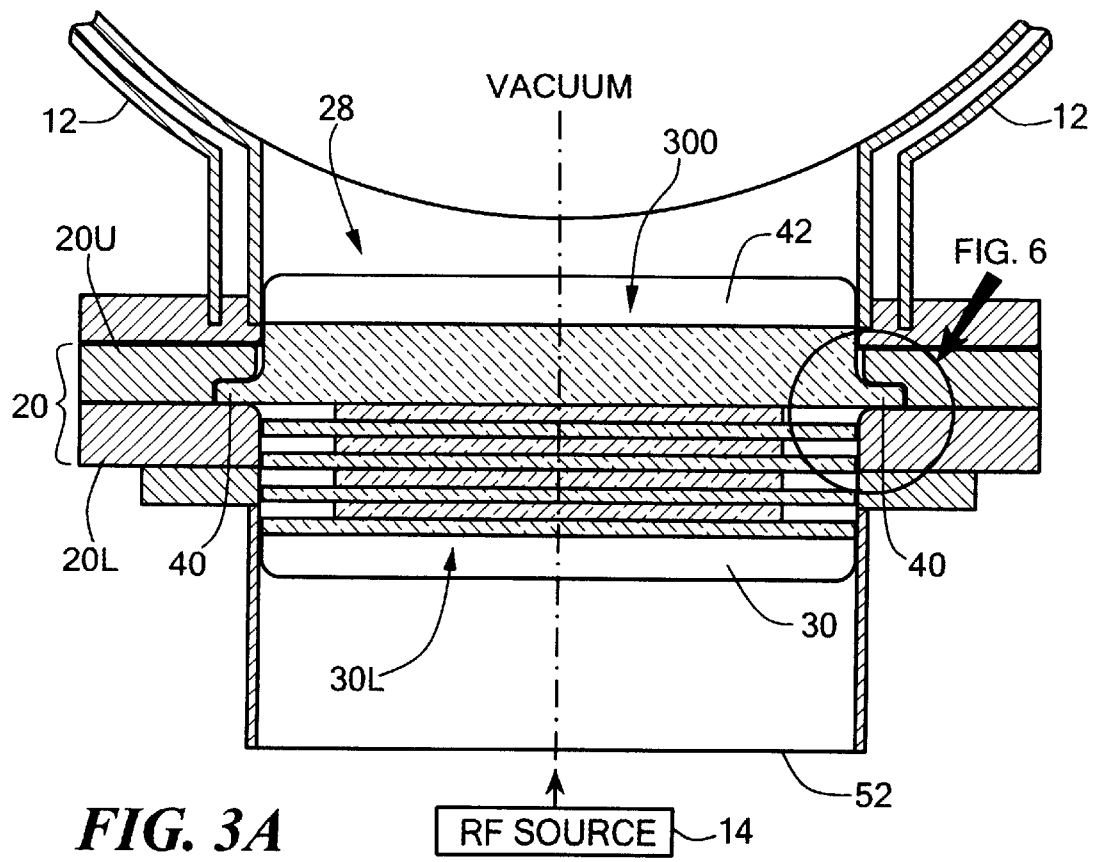
FIG. 3A is a cross-sectional view of the microwave window structure of FIG. 2 affixed to a low-pressure chamber and being fed microwave energy from a source thereof external to the chamber, such energy passing from the source, through a microwave window of such structure of FIG. 2.
Figure 3B:
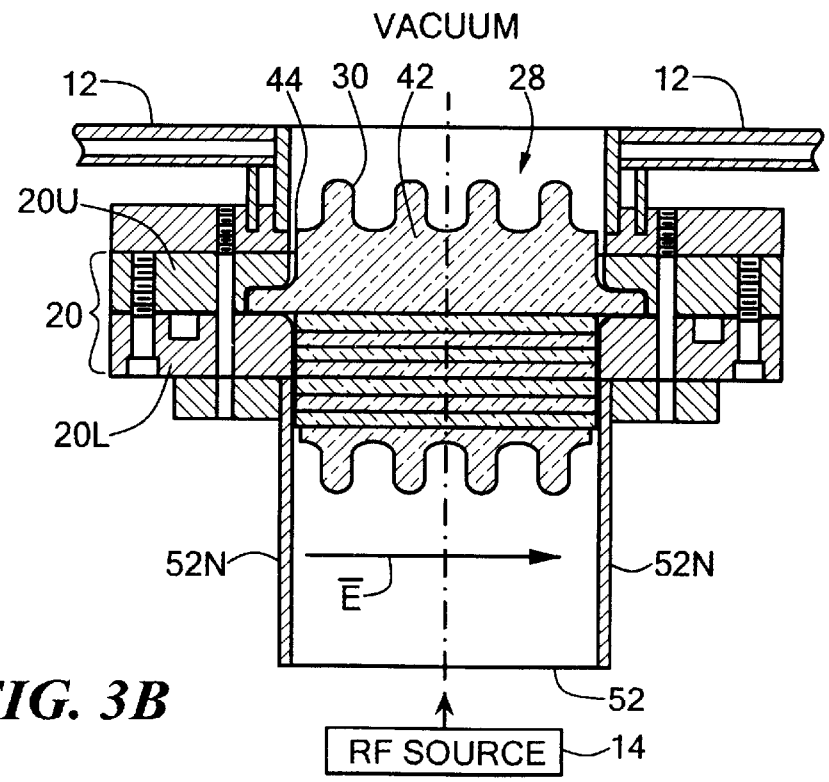
FIG. 3B is a different cross-sectional view of the microwave window structure of FIG. 2 affixed to a low-pressure chamber and being fed microwave energy from a source thereof external to the chamber, such energy passing from the source, through a microwave window of such structure of FIG. 2, into the chamber, such cross section orthognal to the cross-sectional view of FIG. 3A.
Figure 4:
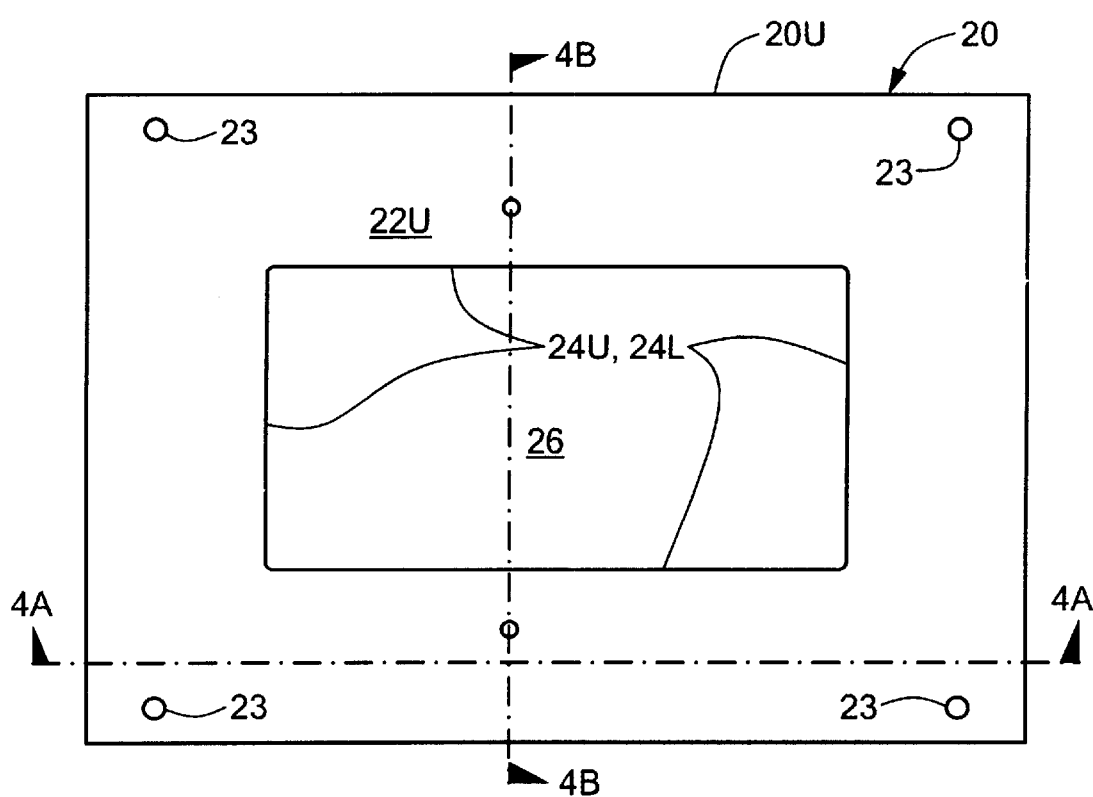
FIG. 4 is a top view of a fixture used in the microwave window structure of FIG. 2.
Figure 4A:
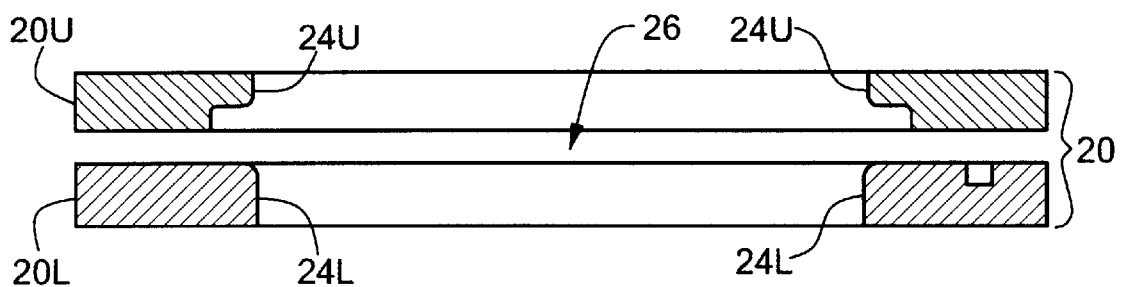
FIG. 4A is an expolded, side elevation cross-sectional view of the fixture of FIG. 4, such croos section being taken along line 4A–4A of FIG. 4.
Figure 4B:
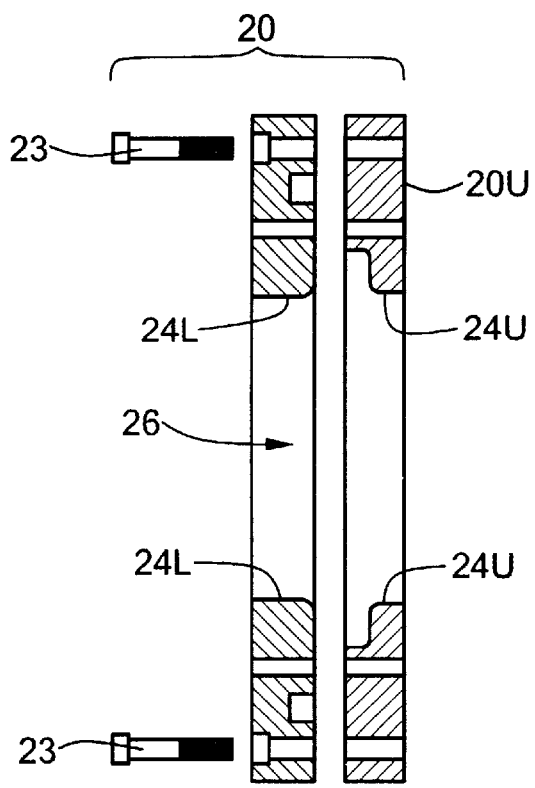
FIG. 4B is an exploded, side elevation cross-sectional view of the fixture of FIG. 4, such cross section being taken along line 4B—4B of FIG. 4.

As shown in FIGS. 3, 3A, and 3B, the window structure 10 includes a fixture 20 (FIGS. 4, 4A and 4B). As shown in FIGS. 4, 4A and 4B, the fixture 20 has an upper portion 20U and a lower portion 20L. The fixture 20 has electrically conductive walls, the conductive walls of the upper portion 20U being indicated by 22U and the conductive wall of the lower portion 20L being indicated by 22L. Inner portions 24U, 24L of the conductive walls 22U, 22L provide a peripheral region of an aperture 26 within such fixture 20. The fixture 20 is adapted for mounting to an opening 28 (FIGS. 3A, 3B) through a sidewall portion of the chamber 12.

As shown in FIGS. 2, 2A and 2B, a solid, microwave energy transparent dielectric window 30 (shown in more detail in FIGS. 5, 5A and 5B) is included in the window structure 10 (FIGS. 2, 2A and 2B). The window 30, shown more clearly in FIGS. 5, 5A and 5B, includes: a periphery portion 40 affixed to the conductive walls 22 of the fixture 20, (FIGS. 2, 2A and 2B); and, an inner region 42 disposed with the aperture 26 of the fixture 20.

More particularly, the upper and lower portions 20U, 20L of fixture 20 engage the periphery portion 40 between them. The upper and lower portions 20U and 20L with the periphery portion 40 sandwiched between them are fastened together with screws 23 (FIGS. 4, 4A and 4B to secure the window 30 to the fixture 20 with the inner region 42 within the aperture 26 of the fixture 20.

It is note that a first surface 30U (FIG. 3A) of the inner region 42 is disposed in the chamber 12 through the opening 28 in chamber 12 and a second, opposite surface 30L of the inner region 42 is disposed external to the chamber 12. The second opposite surface 30L has incident thereon the microwave energy being introduced by source 14, FIGS. 3A and 3B.

Figure 5:
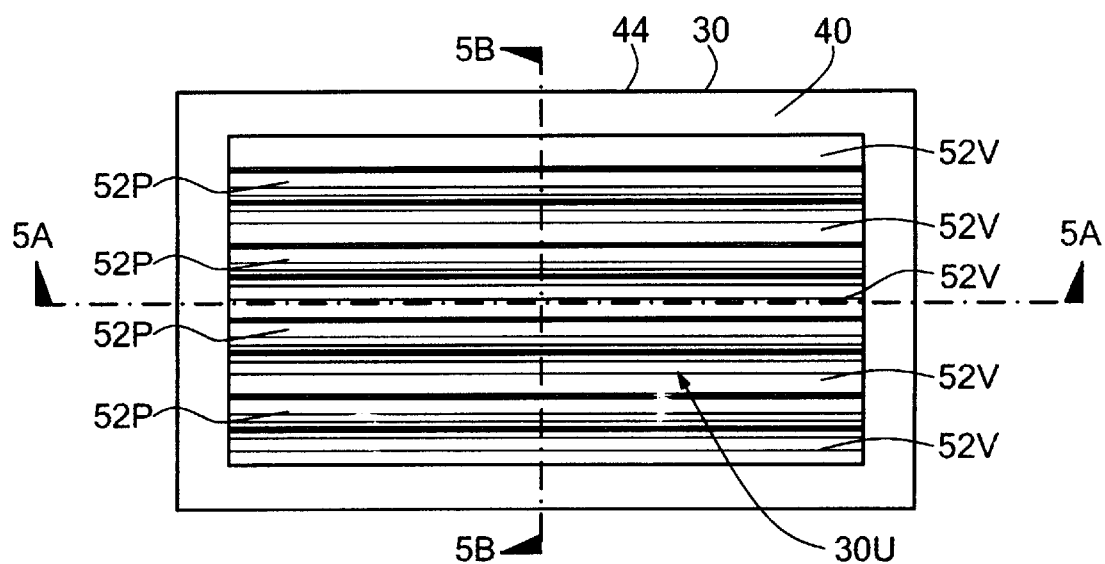
FIG. 5 is a top view of a microwave window used in the microwave window structure of FIG. 2.
Figure 5A:
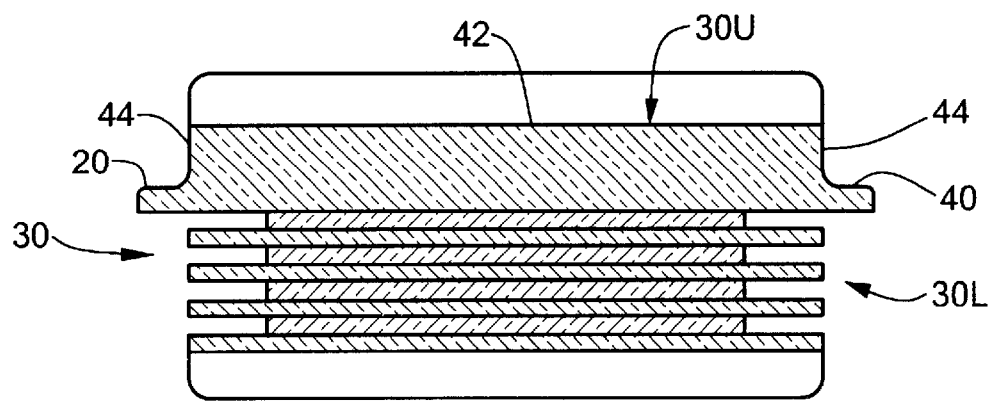
FIG. 5A is a cross-sectional view of the microwave window of FIG. 5, such cross section being taken along line 5A—5A of FIG. 5.
Figure 5B:
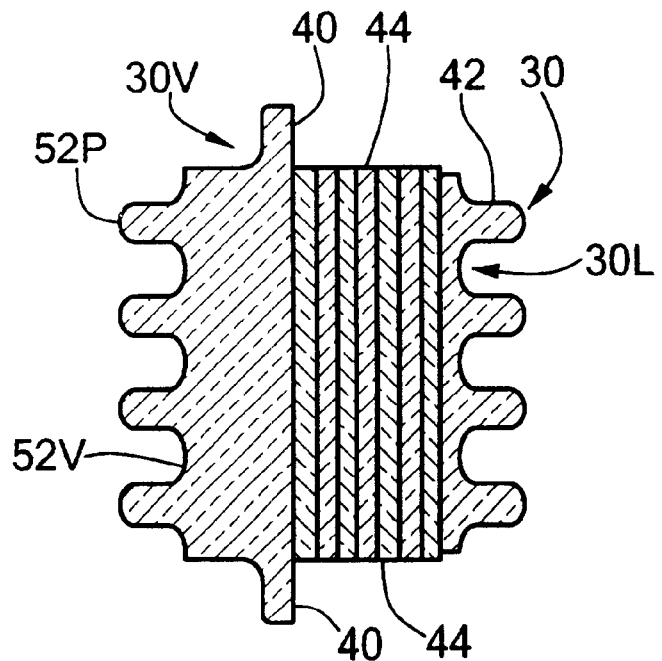
FIG. 5B is a cross-sectional view of the microwave window of FIG. 5, such cross section being taken along line 5B—5B of FIG. 5.
Figure 6:
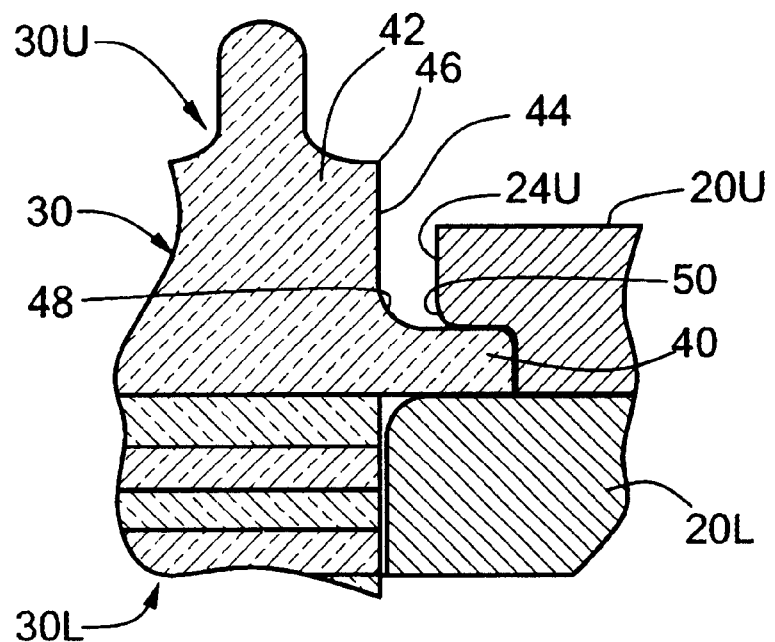
FIG. 6 is a cross-sectional view of an enlarged portion of the microwave window structure of FIG. 3A, such portion being indicated by the arrow 6 in FIG. 3A.

Referring to FIGS. 5, 5A, 5B and 6, it is noted that the window 30 has a sidewall portion 44 with a first end 46 thereof terminating in the first surface 30U and a second end 48 thereof terminating at the periphery portion 40. The sidewall portion 44 of the window 30 is spaced from the wall 22U of the upper portion 20U of fixture 10 as shown in FIG. 6.

The periphery portion 40 of the window 30 contacts the inner portion 24U of the walls of the fixture 20 adjacent a rounded region 50 of such inner portions of the wall. The sidewall portion 44 of the window 30 is parallel to the upper, inner wall of the fixture portion 20U, as shown in FIGS. 5 and 2B. (It is noted that the microwave energy from source 14 is fed to the window 30 though a rectangular waveguide. The waveguide 52 has the narrow walls 52N (FIG. 2B) thereof support the electric field E. Thus, it is noted that the sidewall portion 44 is perpendicular to the electric field vector E, as shown in FIG. 3B). Referring to FIGS. 4, 4A and 4B, the second surface 30L of the window 30 has affixed thereto a corrugated structure having a dielectric constant greater than the dielectric constant of the upper portion 30U of the window 30. Also, a stack of dielectric plates with alternating lengths fills the waveguide volume abutting the window. The waveguide itself is not modified. The dielectric stack, electrically (RF) a part of the window structure, reduces the peak E-field strength at the vacuum side of the window. The elements in the stack are made any high-dielectric-constant, low-loss-tangent material, here Teflon material. Every other plate of the stack is smaller in the H-direction of the waveguide than the adjacent, full-sized plates. The purpose of the stack is to cause the incident single-mode radiation to go multi-mode, thereby making the electric field more uniform. Thus, while a waveguide is designed to operate with only one mode possible, here the waveguide has a has a half-cosine distribution of E-field strength across the wider dimension of the guide, with the maximum in the center. By going multimode, waves with multiple cosine patterns become possible. By distributing the wave energy into many modes with lots of smaller peaks, the E-field becomes more uniform. A more uniform field will have lower field maxima, and is therefore less likely to cause arc breakdown. The design of the stack also serves to match the wave into the higher-dielectric-constant material, minimizing reflected power.

The first surface 30U of the window 30 has peaks 52P and valleys 52V therein, such peaks 52P being separated one from the other by a length less than the nominal-operating wavelength of the microwave energy being introduced into the chamber 12 through the window 30. Thus, a sub-wavelength structure is provided which also serves to eliminate microwave reflections caused by the jump in dielectric constant at the surface of the window parallel to the E-vector (i.e., the electric field vector). Thus, while sub-wavelength structures such as those described in "Antireflection Structured Surfaces for the Infrared Spectral Region" by D. H. Raguin and G. M. Moris, Applied Optics pages 1154–1167 March 1993, act in a manner similar to graded-index coatings to reduce or eliminate reflections of electromagnetic reflections, reflections can also be eliminated by adjusting the thickness of reflecting elements such that multiple reflected waves add out of phase and thus cancel out. However, this approach has the disadvantage of creating standing waves with potentially high electric fields in between the structures that produce the canceling reflected waves. Here, the major advantage of the sub-wavelength structure is that the blades that are a part of these structures can run parallel to the electric filed vector thereby making the path length along the surface much longer in that direction and breaking up the surface into regions of relatively small potential differences.

A number of embodiments of the invention have been described. Nevertheless, it will be understood that various modifications may be made without departing from the spirit and scope of the invention. Accordingly, other embodiments are within the scope of the following claims.

What is claimed is:

1. A window structure for a low pressure chamber, such window structure enabling microwave energy to be introduced into the chamber from a source external to the chamber, such structure comprising:
    a fixture having electrically conducive walls, such inner portions of the walls providing a peripheral region of an aperture within such fixture, such fixture being adapted for mounting to a sidewall portion of the chamber;
    a solid microwave energy transparent dielectric window having:
        a periphery portion affixed to the fixture;
        an inner region disposed within the aperture of the fixture, a first surface of the inner region being disposed in the chamber and a second, opposite surface of the inner region widow being disposed external to the chamber;
        a sidewall portion having a first end terminating in the first surface and a second end terminating at the periphery portion, such sidewall portion of the window being spaced from the walls of the fixture.

2. The window structure recited in claim 1 wherein the periphery portion of the window contacts the inner portions of the walls of the fixture adjacent a rounded region of such inner portions of the walls.

3. The window structure recited in claim 2 wherein the sidewall portion of the window is parallel to the inner walls of the fixture.

4. The window structure recited in claim 2 wherein the second surface of the window has a corrugated structure having a dielectric constant greater than the dielectric constant of the window.

5. The window structure recited in claim 4 wherein the first surface of the window has peaks and walls therein, such peaks being separated one from the other by a length less than the nominal operating wavelength of the microwave energy being introduced into the chamber through the window.

6. A window structure for a low pressure chamber, such window structure enabling microwave energy to be introduced into the chamber from a source external to the chamber, such structure comprising:
    a fixture having electrically conducive walls, such inner portions of the walls providing a peripheral region of an aperture within such fixture, such fixture being adapted for mounting to a sidewall portion of the chamber;
    a solid microwave energy transparent dielectric window having:
        a periphery portion affixed to the fixture;
        an inner region disposed within the aperture of the fixture, a first surface of the inner region being disposed in the chamber and a second, opposite surface of the inner region widow being disposed external to the chamber;
        wherein the periphery portion of the window contacts the inner portions of the walls of the fixture adjacent a rounded region of such inner portions of the walls.

7. The window structure recited in claim 6 wherein the sidewall portion of the window is parallel to the inner walls of the fixture.

8. The window structure recited in claim 7 wherein the second surface of the window has affixed thereto a corrugated structure having a dielectric constant greater than the dielectric constant of the window.

9. The window structure recited in claim 8 wherein the first surface of the window has peaks and walls therein, such peaks being separated one from the other by a length less than the nominal operating wavelength of the microwave energy being introduced into the chamber through the window.

10. A window structure for a low pressure chamber, such window structure enabling microwave energy to be introduced into the chamber from a source external to the chamber, such structure comprising:
    a fixture having electrically conducive walls, such inner portions of the walls providing a peripheral region of an aperture within such fixture, such fixture being adapted for mounting to a sidewall portion of the chamber;
    a solid microwave energy transparent dielectric window having:
        a periphery portion affixed to the fixture;
        an inner region disposed within the aperture of the fixture, a first surface of the inner region being disposed in the chamber and a second, opposite surface of the inner region widow being disposed external to the chamber;
        a sidewall portion having a first end terminating in the first surface and a second end terminating at the periphery portion, such sidewall portion of the window being spaced from the walls of the fixture; and
        wherein the sidewall portion of the window is parallel to the inner walls of the fixture.

11. The window structure recited in claim 10 wherein the second surface of the window has affixed thereto a corrugated structure having a dielectric constant greater than the dielectric constant of the window.

12. The window structure recited in claim 11 wherein the first surface of the window has peaks and walls therein, such peaks being separated one from the other by a length less than the nominal operating wavelength of the microwave energy being introduced into the chamber through the window.

13. A window structure for a low pressure chamber, such window structure enabling microwave energy to be introduced into the chamber from a source external to the chamber, such structure comprising:
    a fixture having electrically conducive walls, such inner portions of the walls providing a peripheral region of an aperture within such fixture, such fixture being adapted for mounting to a sidewall portion of the chamber;
    a solid microwave energy transparent dielectric window having:
        a periphery portion affixed to the fixture;
        an inner region disposed within the aperture of the fixture, a first surface of the inner region being disposed in the chamber and a second, opposite surface of the inner region widow being disposed external to the chamber;
    a sidewall portion having a first end terminating in the first surface and a second end terminating at the periphery portion, such sidewall portion of the window being spaced from the walls of the fixture; and wherein the second surface of the window has affixed thereto a corrugated structure having a dielectric constant greater than the dielectric constant of the window.

14. The window structure recited in claim 13 wherein the first surface of the window has peaks and walls therein, such peaks being separated one from the other by a length less than the nominal operating wavelength of the microwave energy being introduced into the chamber through the window.

15. A window structure for a low pressure chamber, such window structure enabling microwave energy to be introduced into the chamber from a source external to the chamber, such structure comprising:

- a fixture having electrically conducive walls, such inner portions of the walls providing a peripheral region of an aperture within such fixture, such fixture being adapted for mounting to a sidewall portion of the chamber;
- a solid microwave energy transparent dielectric window having:
  - a periphery portion affixed to the fixture;
  - an inner region disposed within the aperture of the fixture, a first surface of the inner region being disposed in the chamber and a second, opposite surface of the inner region widow being disposed external to the chamber;
  - a sidewall portion having a first end terminating in the first surface and a second end terminating at the periphery portion, such sidewall portion of the window being spaced from the walls of the fixture; and
  - wherein the first surface of the window has peaks and walls therein, such peaks being separated one from the other by a length less than the nominal operating wavelength of the microwave energy being introduced into the chamber through the window.

16. A window structure for a low pressure chamber, such window structure enabling microwave energy to be introduced into the chamber from a source external to the chamber, such structure comprising:

- a fixture having electrically conducive walls, such inner portions of the walls providing a peripheral region of an aperture within such fixture, such fixture being adapted for mounting to a sidewall portion of the chamber;
- a solid microwave energy transparent dielectric window having:
  - a periphery portion affixed to the fixture;
  - an inner region disposed within the aperture of the fixture, a first surface of the inner region being disposed in the chamber and a second, opposite surface of the inner region widow being disposed external to the chamber; and
  - wherein the first surface of the window has peaks and walls therein, such peaks being separated one from the other by a length less than the nominal operating wavelength of the microwave energy being introduced into the chamber through the window.

17. A window structure for a low pressure chamber, such window structure enabling microwave energy to be introduced into the chamber from a source external to the chamber, such structure comprising:

- a fixture having electrically conducive walls, such inner portions of the walls providing a peripheral region of an aperture within such fixture, such fixture being adapted for mounting to a sidewall portion of the chamber;
- a solid microwave energy transparent dielectric window having:
  - a periphery portion affixed to the fixture;
  - an inner region disposed within the aperture of the fixture, a first surface of the inner region being disposed in the chamber and a second, opposite surface of the inner region widow being disposed external to the chamber; and
  - wherein the second surface of the window has affixed thereto a structure having a dielectric constant greater than the dielectric constant of the window.

18. The window structure recited in claim 17 wherein the surface affixed to the second surface of the window has a surface for intercepting the introduced microwave energy, such surface being a corrugated surface.

* * * * *